United States Patent [19]
Reddy et al.

[11] Patent Number: 4,494,223
[45] Date of Patent: Jan. 15, 1985

[54] SEQUENTIALLY CLOCKED SUBSTRATE BIAS GENERATOR FOR DYNAMIC MEMORY

[75] Inventors: Chitranjan N. Reddy; G. R. Mohan Rao, both of Houston, Tex.

[73] Assignee: Texas Instruments Incorporated, Dallas, Tex.

[21] Appl. No.: 418,899

[22] Filed: Sep. 16, 1982

[51] Int. Cl.³ .................. G11C 13/00; G11C 11/40
[52] U.S. Cl. .................... 365/233; 365/149; 365/182
[58] Field of Search ............ 365/233, 189, 230, 149, 365/182

[56] References Cited
U.S. PATENT DOCUMENTS

4,419,739 12/1983 Blum .................................. 365/233
4,455,628 1/1984 Ozaki et al. ........................ 365/233

Primary Examiner—Terrell W. Fears
Attorney, Agent, or Firm—John G. Graham

[57] ABSTRACT

A dynamic read/write memory device constructed in a semiconductor chip of the MOS VLSI type employs an on-chip substrate bias generator which is sequentially clocked by the clocks used in operation of the memory. The impact ionization current associated with each clock operation is thus individually supplied, and when a clock is not used the substrate bias for this clock is not generated.

10 Claims, 11 Drawing Figures

SEQUENTIALLY CLOCKED SUBSTRATE BIAS GENERATOR FOR DYNAMIC MEMORY

BACKGROUND OF THE INVENTION

This invention relates to semiconductor memory devices and more particularly to a substrate bias generator for a dynamic memory device of the type having a large number of internal clocks as associated with multiplexed row and column addresses.

As the sealing of MOS devices continues, second-order effects in basic MOS device operation are becoming more dominant in circuit performance. One of these second-order effects is the substrate current generated by impact ionization. This impact ionization current is a major portion of the substrate current which must be supplied for a clocked circuit, especially for a 256K dynamic RAM type of device, where the cell access is done through a clock sequence.

It is the principal object of this invention to provide an improved substrate bias generator for use in a dynamic RAM of the type having multiple clocks as associated with multiplexed row and column addresses, for example, particularly to prevent variation in voltage levels of the substrate bias with changing conditions of the internal clocks. Another object is to provide a substrate bias generator which supplies current associated with impact ionization for separate sequential clocks.

SUMMARY OF THE INVENTION

In accordance with one embodiment of the invention, a dynamic read/write memory device constructed in a semiconductor chip of the MOS VLSI type employs an on-chip substrate bias generator which is sequentially clocked by the clocks used in operation of the memory. The impact ionization current associated with each clock operation is thus individually supplied, and when a clock is not used the substrate bias for this clock is not generated.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows:

DETAILED DESCRIPTION OF SPECIFIC EMBODIMENT

Figure 1:
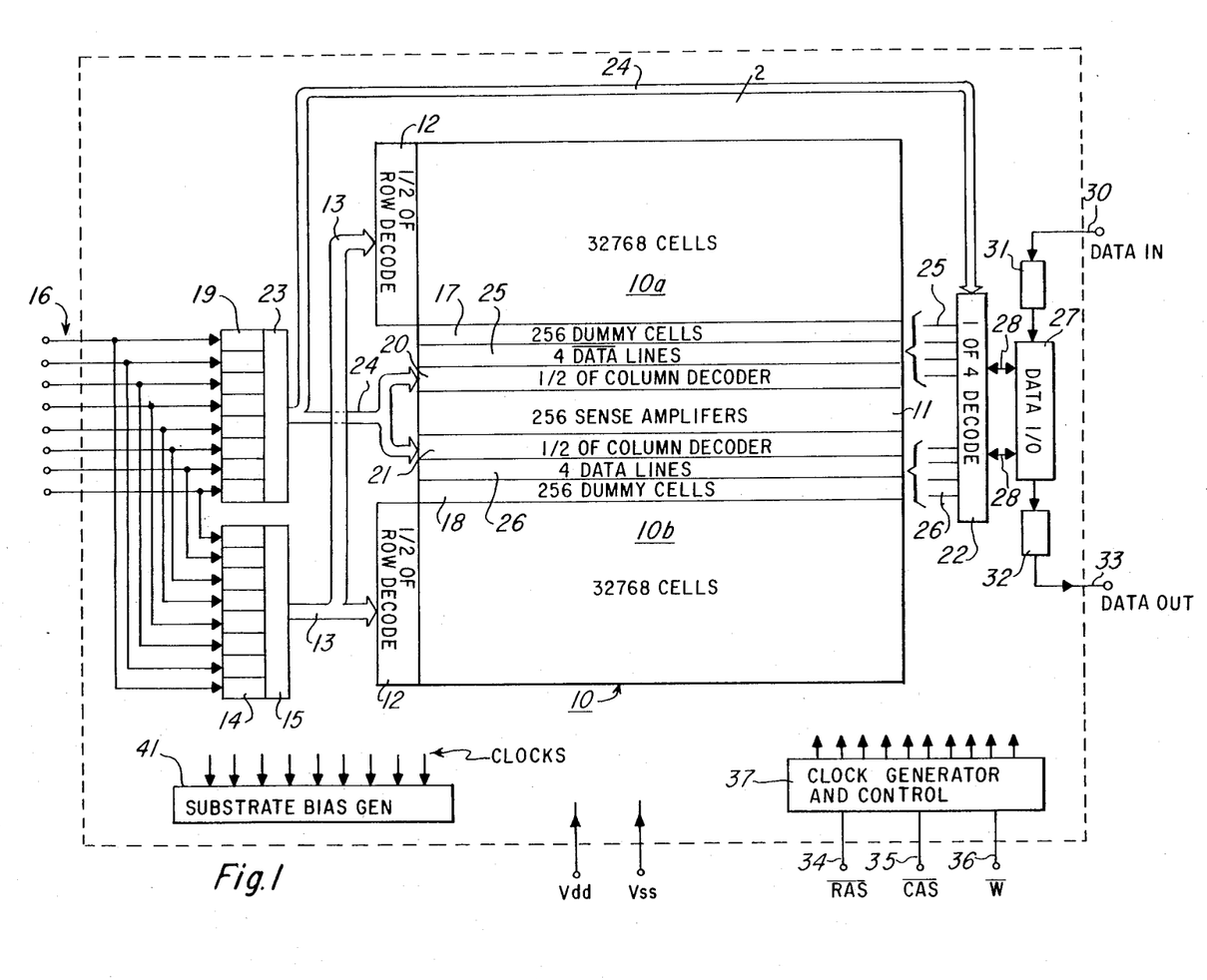
FIG. 1 is an electrical diagram in block form of a semiconductor dynamic memory device which may use the substrate bias generator of the invention.

Referring to FIG. 1, a memory device which may utilize features of the substrate bias generator of invention is illustrated in block diagram form. This is a random access, read/write memory of the dynamic type, made by an N-channel, self-aligned, silicon gate, double-level-polysilicon, MOS process. All of the memory device of FIG. 1 is included in one silicon chip of about 30,000 square mils in size which usually would be mounted in a standard dual-in-line package having sixteen pins or terminals. This type of device is now commercially available under the part number TMS 4164, and as such does not use a substrate bias, but other 64K RAMs of this class do use substrate bias. Of course, the features of the invention may be used in 256K or 1-Megabit dynamic RAMs now being designed. However, in the example of FIG. 1, the device includes an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half of each column line being in each of the halves 10a and 10b; of course, folded bit lines, the electrical equivalent, may be employed. There are 256 sense amplifiers 11 in the center of the array; these are differential type bistable circuits made according to the invention disclosed and claimed in U.S. Pat. No. 4,239,993 assigned to Texas Instruments. Each sense amplifier is connected in the center of a column line, so 128 memory cells are connected to each side of each sense amplifier by a column line half. The chip requires only a single +5 V Vdd supply, along with a ground terminal Vss.

A row of X address decoder 12, split into two halves, is connected by sixteen A and $\overline{A}$ lines 13 to eight address buffers or latches 14 via output circuits 15. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of a dummy cells 18 is activated. The address signals on the input lines 16 are multiplexed; the Y addresss is also applied to these input lines and is latched into a set of eight buffers 19; from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single-bit data input is applied by an input terminal 30 to a data input latch 31, and the output of this latch is coupled to the data I/O control 27. The latch 31 which may be of the same circuit design as the address buffer circuits 14 and 19, is a circuit as shown in U.S. Pat. No. 4,280,070. One-bit data output is connected from the data I/O control 27 through a buffer 32 to a data-out terminal 33.

Figure 2A:
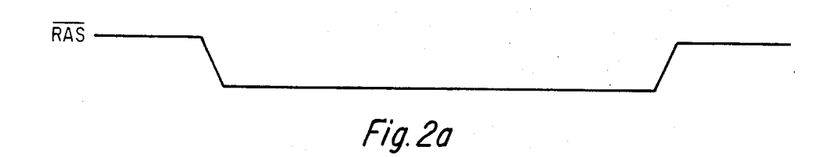
FIGS. 2a-2g are graphic representations of voltage vs time, or other conditions vs time, existing for various parts of the device of FIG. 1.
Figure 2B:
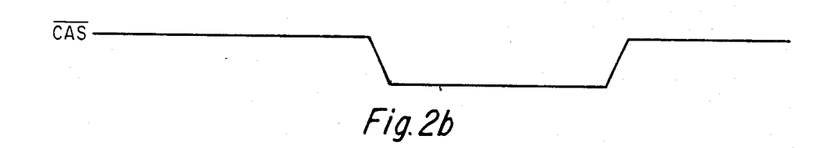
Figure 2C:
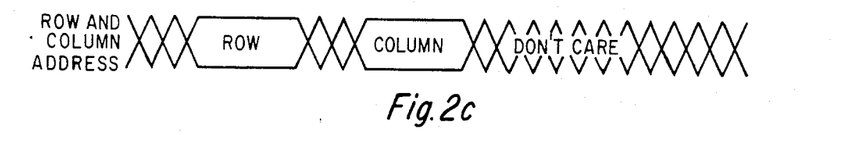
Figure 2D:
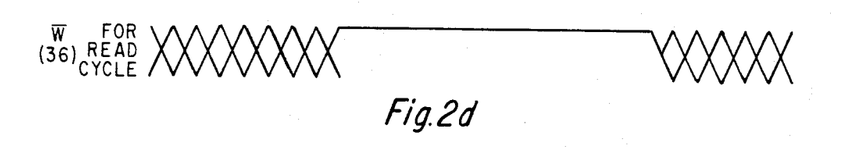
Figure 2E:
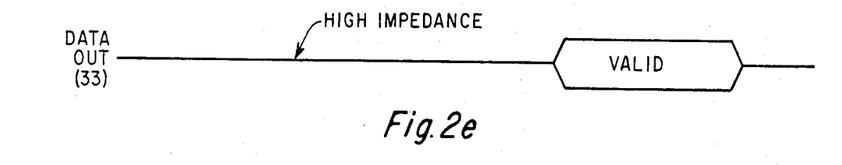
Figure 2F:
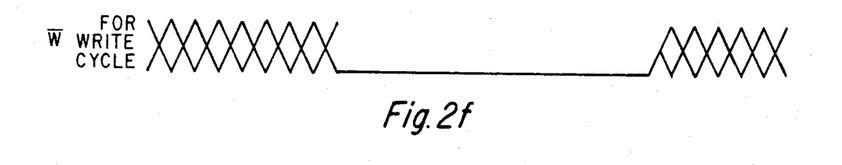
Figure 2G:
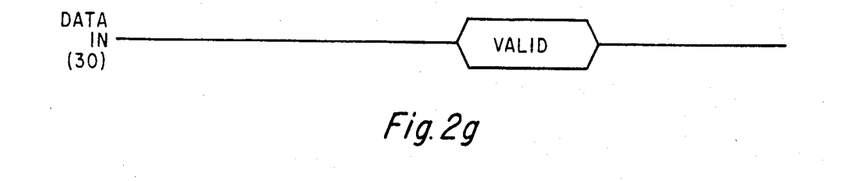

The X addresss must appear on the inputs 16 when a row address strobe signal, referred to as $\overline{RAS}$, is applied to an input 34. Likewise, the Y address must appear during a column address strobe signal $\overline{CAS}$ on an input 35. A read/write control $\overline{W}$ on an input 36 is the other control signal for this device, although some devices employ a chip-select command. These three inputs are the basic timing clocks of the system, and are applied to clock generator and control circuitry 37 which generates a large number of clocks and control signals as discussed below to define the operation of various parts of the device. For example when $\overline{RAS}$ goes low as seen in FIG. 2a, clocks derived from $\overline{RAS}$ cause the buffers 14 to accept and latch the eight TTL level bits then appearing on the input lines 16. When $\overline{CAS}$ goes low as seen in FIG. 2b then clocks generated in the circuitry 37 cause the buffers 19 to latch on the TTL level Y address signals on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data out pin stays in a high impedance state during a write-only cycle. A read-/write cycle is also possible.

Figure 3:
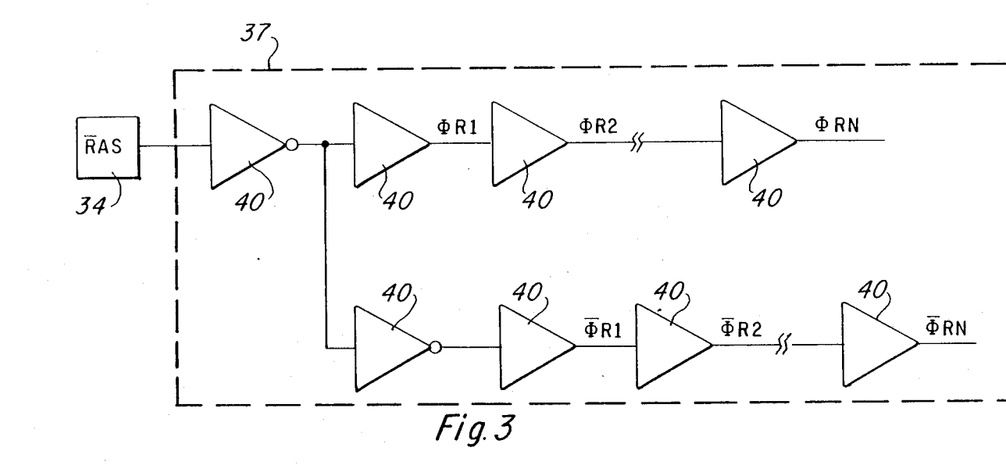
FIG. 3 is an electrical schematic diagram of part of the clock generators in the device of FIG. 1.
Figure 4:
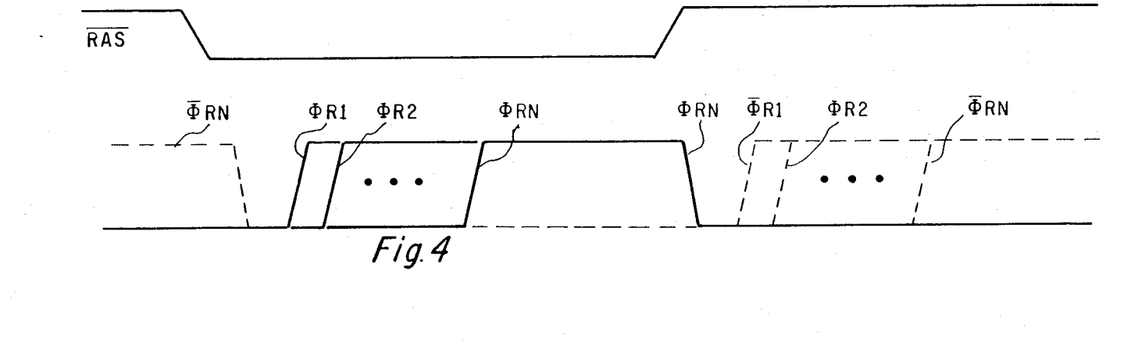
FIG. 4 is a graphic representation of voltage vs time for the various clocks of the circuit of FIG. 3.

Referring to FIG. 3, an arrangement for generating the $\overline{RAS}$-related clocks in the clock generator 37 is illustrated. When the input $\overline{RAS}$ goes low, all of the active-cycle clocks $\Phi R1$, $\Phi R2$, ... $\Phi Rn$ of FIG. 4 are generated in sequence, using delay circuits 40 of the type shown in U.S. Pat. No. 4,239,990, issued to Hong, Reese and Redwine, assigned to Texas Instruments. Likewise, when $\overline{RAS}$ goes high, all of the precharge-cycle clocks $\Phi R1$, $\Phi R2$, ... $\Phi Rn$ of FIG. 4 are generated in the circuit 37 in sequence. Each of these clocks produces a burst of impact ionization current.

Figure 5:
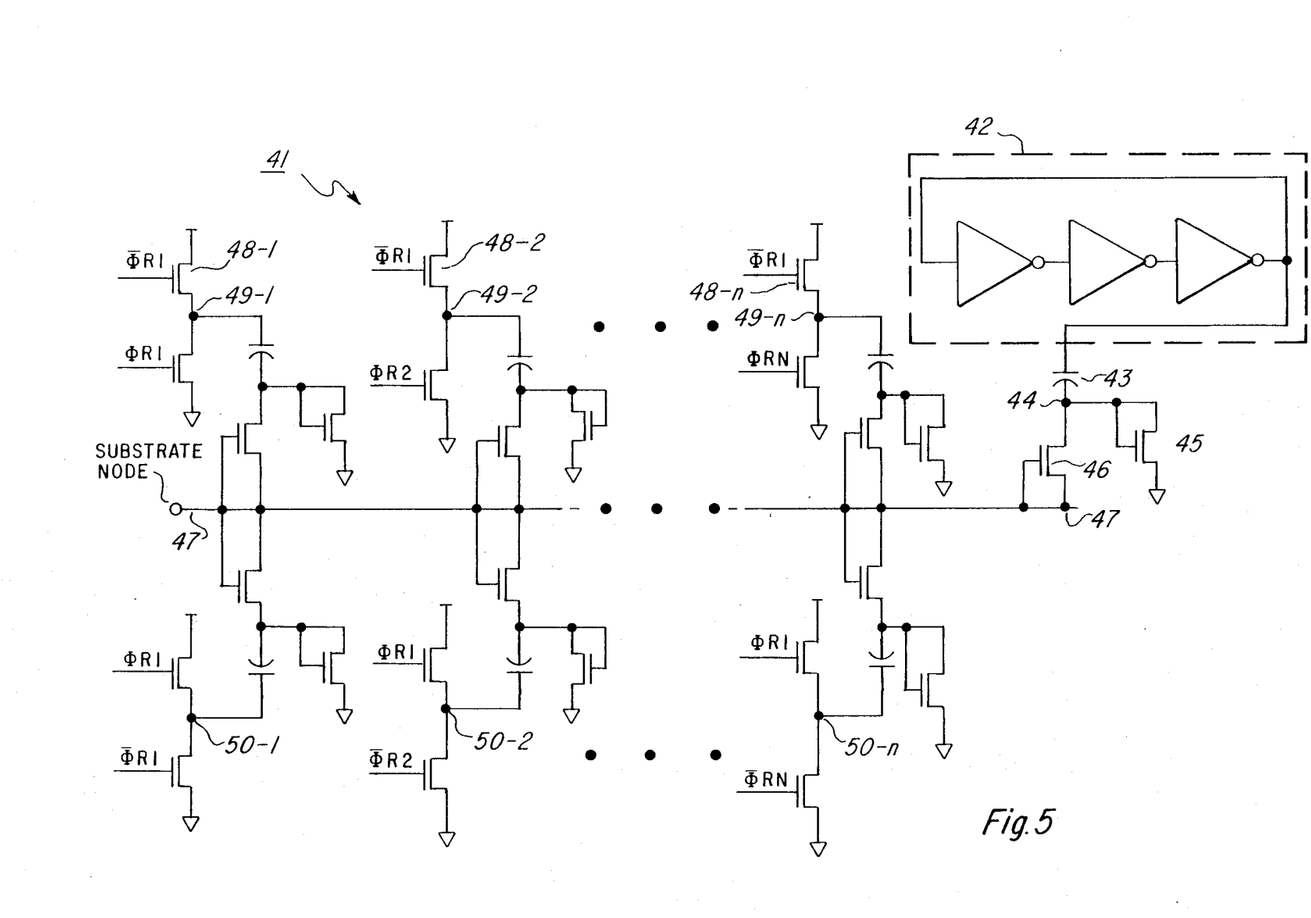
FIG. 5 is an electrical schematic diagram of the substrate bias generator of the invention.

To supply bias for these bursts of impact ionization current, a sequentially clocked substrate bias generator 41 as shown in FIG. 5 is included on the semiconductor chip with the memory array 10. A free running oscillator 42 of conventional form supplies positive-going pulses at a reptition rate of about 1 MHz to a capacitor 43 and thus to a node 44. An MOS diode 45 functions to tend to clamp the voltage on the node 44 toward ground potential during the +5 V part of the periodic pulse applied from the oscillator 42. The diode 45 is a transistor with gate shorted to drain, and when the drain is at a positive voltage with respect to Vss, above the threshold, the transistor 45 conducts, holding the node 44 near Vss. Then, when the negative-going transistion occurs in the oscillator 42 output, i.e., +5 V to zero, this will appear on node 44 as a negative spike through the capacitor 43, and the transistor 45 cuts off. When the node 44 is negative with respect to Vss, current can flow through the transistor 46 from the substrate node 47 because transistor 46 has its gate shorted to its drain (the substrate 47). The substrate is thus pumped to a negative voltage level by these current spikes.

The frequency of the oscillator 42 and the sizes of the capacitor 43 and devices 45 and 46 are selected to provide a minimum background or steady-state substrate bias to supply the junction leakage current. In order to supply the impact ionization curent and compensate for the varying levels of substrate bias appropriate for different operating conditions, however, a number of additional bias sources are included. Each of these consists of a capacitor 43-1, 43-2, ... 43-n, a node 44-1, 44-2, ... 44-n, and MOS diodes 45-1 ... 45-n and 46-1 ... 46-n, as before, coupled to the substrate node 47. Instead of the oscillator 42, however, clocks such as $\Phi R1$, $\Phi R2$, etc., are used to provide the pulse sources. By transistors 48, the precharge clock $\Phi R1$ charges to Vdd all of the nodes 49-1, 49-2, ... 49-n connected to the capacitors and after $\Phi R1$ goes low the active clocks $\Phi R1$, $\Phi R2$ ... $\Phi Rn$ go high in sequence, thereby discharging the capacitors 43-1, etc. in the same sequence. The magnitude of each capacitor is made proportional to the impact ionization generated by each clock, which in turn is proportional to the amount of time each MOS transistor in that clock generator is operated in saturation. The same principal is applied for the precharge cycle where $\Phi R1$ charges all of the nodes 50-1, 50-2, ... 50-n during the active cycle, and the capacitors are discharged by the corresponding precharge clocks $\Phi R1$, $\Phi R2$ ... $\Phi Rn$. Similar generator circuits would be provided for the $\overline{CAS}$-related clocks, and other clocks.

This technique is of particular importance in dynamic RAMs where the part must function in different modes depending upon the $\overline{RAS}$ and $\overline{CAS}$ combinations (e.g., page mode, $\overline{RAS}$-only refresh, etc.). Each of these operations have a different effect on the device, which generally results in a tendency for the Vbb voltage on the substrate node 47 to drift; however, the generator of FIG. 5 supplies the substrate current only for the amount of time and magnitude needed without undue power dissipation. When a clock does not occur, then the bias ordinarily supplied for such clock is not generated, so over-voltage does not occur.

Multiple sets of the generators of FIG. 5 may be used on a chip, one in each corner, for example, so that the bias would be more evenly distributed. Guard rings biased at Vbb Vdd or Vss may be added around the ground nodes 44 to reduce collection efficiency of injected minority carriers.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device having a plurality of separate sequential clock voltages occuring in a semiconductor substrate, and a sequential clock generator having a plurality of bias circuits each individually driven by a separate one of said clocks to supply substrate bias voltage to said semiconductor substrate.

2. A device according to claim 1 wherein said each of said bias circuits comprises a clock node, a bias node, a capacitor, and first and second unidirectional devices, the capacitor connecting the clock node to the bias node, the first unidirectional device connecting the bias node to reference potential, the second unidirectional device connecting the bias node to said semiconductor substrate.

3. A device according to claim 2 wherein each of said clock voltages is coupled to the clock node of a separate one of the bias circuits.

4. A device according to claim 3 wherein the sizes of said capacitors and unidirectional devices are selected according to the amount of impact ionization current necessary for circuit operation corresponding to each separate clock voltage.

5. A device according to claim 1 wherein said substrate contains an MOS dynamic read/write memory and at least some of said clock voltages are generated from address strobes supplied to the memory.

6. A device according to claim 5 wherein said address strokes include row address and column address, and operating nodes are provided for the memory wherein column address stroke does not occur.

7. A substrate bias generator constructed in a semiconductor chip with a memory circuit or the like which has a plurality of separate sequentially-occuring clock voltages, comprising:
a plurality of separate injector circuits each individually driven by a separate one of said clock voltages to supply substrate bias to said semiconductor chip correlated in time with the clock voltages.

8. A device according to claim 7 wherein said each of said injector circuits comprises a clock node, a bias node, a capacitor, and first and second unidirectional devices, the clock voltages being connected separately to each clock node, the capacitor connecting the clock node to the bias node, the first unidirectional device connecting the bias node to reference potential, the second unidirectional device connecting the bias node to said semiconductor chip.

9. A device according to claim 8 wherein at least some of said clock voltages coupled to the clock node of separate ones of the injector circuits are present in less than all operating cycles.

10. A device according to claim 8 wherein the sizes of said capacitors and unidirectional devices are selected according to the amount of impact ionization current associated with circuit operation corresponding to each separate clock voltage.

* * * * *

REEXAMINATION CERTIFICATE (3859th)

United States Patent [19]
Reddy et al.

[11] B1 4,494,223
[45] Certificate Issued Sep. 7, 1999

[54] SEQUENTIALLY CLOCKED SUBSTRATE BIAS GENERATOR FOR DYNAMIC MEMORY

[75] Inventors: Chitranjan N. Reddy; G. R. Mohan Rao, both of Houston, Tex.

[73] Assignee: Texas Instruments Incorporated, Dallas, Tex.

Reexamination Request:
No. 90/004,858, Dec. 5, 1997

Reexamination Certificate for:
Patent No.: 4,494,223
Issued: Jan. 15, 1985
Appl. No.: 06/418,899
Filed: Sep. 16, 1982

[51] Int. Cl.[6] .................................................. G11C 13/00
[52] U.S. Cl. ........................... 365/233; 365/149; 365/182

[56] References Cited

U.S. PATENT DOCUMENTS

| | | | |
|---|---|---|---|
| 3,942,047 | 3/1976 | Buchanan | 307/297 |
| 4,223,238 | 9/1980 | Parkinson et al. | 307/297 |
| 4,307,333 | 12/1981 | Hargrove | 323/313 |
| 4,430,581 | 2/1984 | Mogi et al. | 307/296 |
| 4,438,346 | 3/1984 | Chuang et al. | 307/297 |
| 4,460,835 | 7/1984 | Masuoka | 307/296 |

*Primary Examiner*—Terrell W Fears

[57] ABSTRACT

A dynamic read/write memory device constructed in a semiconductor chip of the MOS VLSI type employs an on-chip substrate bias generator which is sequentially clocked by the clocks used in operation of the memory. The impact ionization current associated with each clock operation is thus individually supplied, and when a clock is not used the substrate bias for this clock is not generated.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, lines 27–67 through Column 3, lines 1–18:

A row of X address decoder 12, split into two halves, is connected by sixteen A and $\overline{A}$ lines 13 to eight address buffers or latches 14 via output circuits 15. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of a dummy cells 18 is activated. The address signals on the input lines 16 are multiplexed; the Y [addresss] *address* is also applied to these input lines and is latched into a set of eight buffers 19; from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single-bit data input is applied by an input terminal 30 to a data input latch 31, and the output of this latch is coupled to the data I/O control 27. The latch 31 which may be of the same circuit design as the address buffer circuits 14 and 19, is a circuit as shown in U.S. Pat. No. 4,280,070. One-bit data output is connected from the data I/O control 27 through a buffer 32 to a data-out terminal 33.

The X [addresss] *address* must appear on the inputs 16 when a row address strobe signal, referred to as $\overline{RAS}$, is applied to an input 34. Likewise, the Y address must appear during a column address strobe signal $\overline{CAS}$ on an input 35. A read/write control $\overline{W}$ on an input 36 is the other control signal for this device, although some devices employ a chip-select command. These three inputs are the basic timing clocks of the system, and are applied to clock generator and control circuitry 37 which generates a large number of clocks and control signals as discussed below to define the operation of various parts of the device. For example when $\overline{RAS}$ goes low as seen in FIG. 2a, clocks derived from $\overline{RAS}$ cause the buffers 14 to accept and latch the eight TTL level bits then appearing on the input lines 16. When $\overline{CAS}$ goes low as seen in FIG. 2b then clocks generated in the circuitry 37 cause the buffers 19 to latch on the TTL level Y address signals on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data out pin stays in a high [impedence] *impedance* state during a write-only cycle. A read/write cycle is also possible.

Column 3, lines 30–68 through Column 4, lines 1–12:

To supply bias for these bursts of impact ionization current, a sequentially clocked substrate bias generator 41 as shown in FIG. 5 is included on the semiconductor chip with the memory array 10. A free running oscillator 42 of conventional form supplies positive-going pulses at a [repition] *repetition* rate of about 1 MHz to a capacitor 43 and thus to a node 44. An MOS diode 45 functions to tend to clamp the voltage on the node 44 toward ground potential during the +5 V part of the periodic pulse applied from the oscillator 42. The diode 45 is a transistor with gate shorted to drain, and when the drain is at a positive voltage with respect to Vss, above the threshold, the transistor 45 conducts, holding the node 44 near Vss. Then, when the negative-going [transistion] *transition* occurs in the oscillator 42 output, i.e., +5 V to zero, this will appear on node 44 as a negative spike through the capacitor 43, and the transistor 45 cuts off. When the node 44 is negative with respect to Vss, current can flow through the transistor 46 from the substrate node 47 because transistor 46 has its gate shorted to its drain (the substrate 47). The substrate is thus pumped to a negative voltage level by these current spikes.

The frequency of the oscillator 42 and the sizes of the capacitor 43 and devices 45 and 46 are selected to provide a minimum background or steady-state substrate bias to supply the junction leakage current. In order to supply the impact ionization [curent] *current* and compensate for the varying levels of substrate bias appropriate for different operating conditions, however, a number of additional bias sources are included. Each of these consists of a capacitor 43-1, 43-2, . . . 43-n, a node 44-1, 44-2, . . . 44-n, and MOS diodes 45-1 . . . 45-n and 46-1 . . . 46-n, as before, coupled to the substrate node 47. Instead of the oscillator 42, however, clocks such as ΦR1, ΦR2, etc., are used to provide the pulse sources. By transistors 48, the precharge clock ΦR1 charges to Vdd all of the nodes 49-1, 49-2, . . . 49-n connected to the capacitors and after ΦR1 goes low the active clocks ΦR1, ΦR2 . . . ΦRn go high in sequence, thereby discharging the capacitors 43-1, etc. in the same sequence. The magnitude of each capacitor is made proportional to the impact ionization generated by each clock, which in turn is proportional to the amount of time each MOS transistor in that clock generator is operated in saturation. The same principal is applied for the precharge cycle where ΦR1 charges all of the nodes 50-1, 50-2, . . . 50-n during the active cycle, and the capacitors are discharged by the corresponding precharge clocks ΦR1, ΦR2 . . . ΦRn. Similar generator circuits would be provided for the $\overline{CAS}$-related clocks, and other clocks.

AS A RESULT OF REEXAMINATION, IT HAS BEEN DETERMINED THAT:

Claims 1, 2, 6, 7 and 8 are determined to be patentable as amended.

Claims 3–5, 9 and 10, dependent on an amended claim, are determined to be patentable.

New claims 11–39 are added and determined to be patentable.

1. A semiconductor device having a plurality of separate sequential clock voltages [occuring] *occurring* in a semiconductor substrate, [and] *the semiconductor device comprising* :

a sequential clock generator having a plurality of bias circuits each individually driven by a separate one of said [clocks] *plurality of separate sequential clock voltages* to supply substrate bias voltage to said semiconductor substrate;

a first bias circuit of said plurality of bias circuits coupled to receive a first clock voltage of said plurality of separate sequential clock voltages for a first mode of operation of the semiconductor device; and a second bias circuit of said plurality of bias circuits coupled to receive a second clock voltage of said plurality of separate sequential clock voltages for a second mode of operation of the semiconductor device.

2. A device according to claim 1 wherein said each of said bias circuits comprises a clock node, a bias node, a capacitor, and first and second unidirectional devices, the capacitor connecting the clock node to the bias node, the first unidirectional device connecting the bias node to *a* reference potential, the second unidirectional device connecting the bias node to said semiconductor substrate.

6. A device according to claim 5 wherein said address [strokes] *strobes* include row address and column address, and operating [nodes] *modes* are provided for the memory wherein column address [stroke] *strobe* does not occur.

7. A substrate bias generator constructed in a semiconductor chip with a memory circuit or the like which has a plurality of separate [sequentially-occuring] *sequentially-occurring* clock voltages, comprising:

a plurality of separate injector circuits each individually driven by a separate one of said clock voltages to supply substrate bias to said semiconductor chip correlated in time with the clock voltages, *wherein a current capacity of each injector circuit is selected according to the amount of impact ionization current associated with circuit operation corresponding to each separate clock voltage.*

8. A device according to claim 7 wherein said each of said injector circuits comprises a clock node, a bias node, a capacitor, and first and second unidirectional devices, the clock voltages being connected separately to each clock node, the capacitor connecting the clock node to the bias node, the first unidirectional device connecting the bias node to *a* reference potential, the second unidirectional device connecting the bias node to said semiconductor chip.

*11. A device according to claim 3 wherein the sequential clock generator further comprises*

*an oscillator circuit for producing an oscillator output signal at an output node and*

*another bias circuit coupled to the output node for providing at least a minimum substrate bias voltage in response to the oscillator output signal.*

*12. A device according to claim 11 wherein the another bias circuit comprises a bias node, a capacitor, and first and second unidirectional devices, the capacitor connecting the output node to the bias node, the first unidirectional device connecting the bias node to a reference potential, the second unidirectional device connecting the bias node to said semiconductor substrate.*

*13. A device according to claim 12 wherein the size of the capacitor of the another bias circuit is selected to produce the at least a minimum substrate bias voltage.*

*14. A device according to claim 8 wherein the sequential clock generator further comprises*

*an oscillator circuit for producing an oscillator output signal at an output node and*

*another bias circuit coupled to the output node for providing at least a minimum substrate bias voltage in response to the oscillator output signal.*

*15. A device according to claim 14 wherein the another bias circuit comprises a bias node, a capacitor, and first and second unidirectional devices, the capacitor connecting the output node to the bias node, the first unidirectional device connecting the bias node to a reference potential, the second unidirectional device connecting the bias node to said semiconductor substrate.*

*16. A device according to claim 15 wherein the size of the capacitor of the another bias circuit is selected to produce the at least a minimum substrate bias voltage.*

*17. A semiconductor device having a plurality of separate sequential clock voltages occurring in a semiconductor substrate, the semiconductor device comprising:*

*an array of memory cells arranged in rows and columns, each column including adjacent column halves in a folded bit line configuration;*

*a plurality of sense amplifier circuits, each sense amplifier circuit coupled to a respective column of memory cells; and*

*a sequential clock generator having a plurality of bias circuits each individually driven by a separate one of said plurality of separate sequential clock voltages to supply substrate bias voltage to said semiconductor substrate.*

*18. A semiconductor device as in claim 17 wherein the memory cells are dynamic memory cells.*

*19. A semiconductor device as in claim 18 wherein the bias circuits are proximate different corners of the semiconductor device, thereby distributing the substrate bias voltage.*

*20. A semiconductor device as in claim 18 wherein each of the plurality of separate sequential clock voltages corresponds to a different mode of operation of the semiconductor device.*

*21. A semiconductor device as in claim 20 wherein a first of the plurality of separate sequential clock voltages corresponds to a row address control signal and a second of the plurality of separate sequential clock voltages corresponds to a column address control signal.*

*22. A semiconductor device as in claim 18 wherein each bias circuit further comprises:*

*a clock node coupled to receive a respective clock voltage from said plurality of separate sequential clock voltages;*

*a capacitor having first and second terminals, wherein the first terminal is coupled to the clock node, and the second terminal is coupled to a bias node;*

*a guard ring formed in the semiconductor substrate substantially around the bias node and connected to a voltage terminal;*

*a first unidirectional device coupled between the bias node and a reference terminal; and*

*a second unidirectional device coupled between the bias node and the semiconductor substrate.*

*23. A semiconductor device as in claim 22 wherein the guard ring is continuous around the bias node.*

*24. A semiconductor device as in claim 22 wherein the voltage terminal is a Vdd supply voltage terminal.*

*25. A semiconductor device as in claim 22 wherein the reference terminal is a Vss supply voltage terminal.*

*26. A semiconductor device as in claim 25 wherein the semiconductor substrate receives a Vbb bias voltage that is negative with respect to the Vss supply voltage.*

*27. A semiconductor device as in claim 18 wherein each of the bias circuits further comprises:*

*a clock node coupled to receive a respective clock voltage from said plurality of separate sequential clock voltages;* a capacitor having first and second terminals, wherein the first terminal is coupled to the clock node, and the second terminal is coupled to a bias node;

a first unidirectional device coupled between the bias node and a reference terminal; and a second unidirectional device coupled between the bias node and the semiconductor substrate.

28. A semiconductor device as in claim 27 wherein the size of each capacitor is determined by the respective bias circuit substrate current.

29. A semiconductor device having a plurality of separate sequential clock voltages, occurring in a semiconductor substrate, the semiconductor device comprising:

a sequential clock generator having a plurality of bias circuits each individually driven by a separate one of said plurality of separate sequential clock voltages to supply substrate bias voltage to the semiconductor substrate, each bias circuit further comprising:

a clock node coupled to receive a respective clock voltage from said plurality of separate sequential clock voltages;

a capacitor having first and second terminals, wherein the first terminal is coupled to the clock node, and the second terminal is coupled to a bias node;

a guard ring formed in the semiconductor substrate substantially around the bias node and connected to a voltage terminal;

a first unidirectional device coupled between the bias node and a reference terminal; and a second unidirectional device coupled between the bias node and the semiconductor substrate.

30. A semiconductor device as in claim 29 wherein the memory cells are dynamic memory cells.

31. A semiconductor device as in claim 30 wherein the bias circuits are proximate different corners of the semiconductor device, thereby distributing the substrate bias voltage.

32. A semiconductor device as in claim 30 wherein each of the plurality of separate sequential clock voltages corresponds to a different mode of operation of the semiconductor device.

33. A semiconductor device as in claim 32 wherein a first of the plurality of separate sequential clock voltages corresponds to a row address control signal and a second of the plurality of separate sequential clock voltages corresponds to a column address control signal.

34. A semiconductor device as in claim 30 wherein the guard ring is continuous around the bias node.

35. A semiconductor device as in claim 30 wherein the voltage terminal is a Vdd supply voltage terminal.

36. A semiconductor device as in claim 30 wherein the reference terminal is a Vss supply voltage terminal.

37. A semiconductor device as in claim 36 wherein the semiconductor substrate receives a Vbb bias voltage that is negative with respect to the Vss supply voltage.

38. A semiconductor device as in claim 30 wherein each of the bias circuits further comprises:

a clock node coupled to receive a respective clock voltage from said plurality of separate sequential clock voltages;

a capacitor having first and second terminals, wherein the first terminal is coupled to the clock node, and the second terminal is coupled to a bias node;

a first unidirectional device coupled between the bias node and a reference terminal; and a second unidirectional device coupled between the bias node and the semiconductor substrate.

39. A semiconductor device as in claim 38 wherein the size of each capacitor is determined by the respective bias circuit substrate current.

\* \* \* \* \*